(12) United States Patent
Hayashi

(10) Patent No.: US 7,495,780 B2
(45) Date of Patent: Feb. 24, 2009

(54) POSITION MEASUREMENT APPARATUS, IMAGING APPARATUS, EXPOSURE APPARATUS, AND DEVICE MANUFACTURING METHOD

(75) Inventor: Nozomu Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/940,975

(22) Filed: Nov. 15, 2007

(65) Prior Publication Data
US 2008/0144047 A1  Jun. 19, 2008

(30) Foreign Application Priority Data
Dec. 19, 2006  (JP) .............................. 2006-341055

(51) Int. Cl.
G01B 11/14  (2006.01)
G01B 11/00  (2006.01)

(52) U.S. Cl. ....................... 356/620; 356/614; 356/400; 356/401

(58) Field of Classification Search ........................ None
See application file for complete search history.

(56) References Cited
U.S. PATENT DOCUMENTS 5,151,750 A * 9/1992 Magome et al. ............. 356/401
5,155,557 A * 10/1992 Iwazawa et al. ............. 356/401
6,108,089 A * 8/2000 Shiraishi ...................... 356/615
6,151,102 A * 11/2000 Nishi ........................... 355/53
2003/0053040 A1* 3/2003 Hayashi et al. ................ 355/55
2005/0062967 A1* 3/2005 Kobayashi ................... 356/400

FOREIGN PATENT DOCUMENTS

JP  6-036990 A  2/1994
JP  2003-203839 A  7/2003

* cited by examiner

Primary Examiner—Gregory J Toatley, Jr.
Assistant Examiner—Gordon J Stock, Jr.
(74) Attorney, Agent, or Firm—Canon U.S.A., Inc. I.P. Division

(57) ABSTRACT

An exposure apparatus performs a relative alignment between a reticle and a substrate, and exposes the substrate to light via a pattern formed on the reticle. The exposure apparatus includes a movable stage that carries one of the reticle and the substrate and a position measurement apparatus that measures a position of at least one of the reticle and the substrate. The position measurement apparatus includes an illumination unit configured to emit light toward a mark that indicates the position of the reticle or the substrate, a light intensity measurement unit configured to measure an intensity of the light, an imaging unit configured to capture an image of the mark, a stage position measurement unit configured to measure a position of the stage, and a signal waveform correction unit configured to correct a signal waveform output from the imaging unit based on a change in stage position and a change in illumination light intensity.

2 Claims, 9 Drawing Sheets

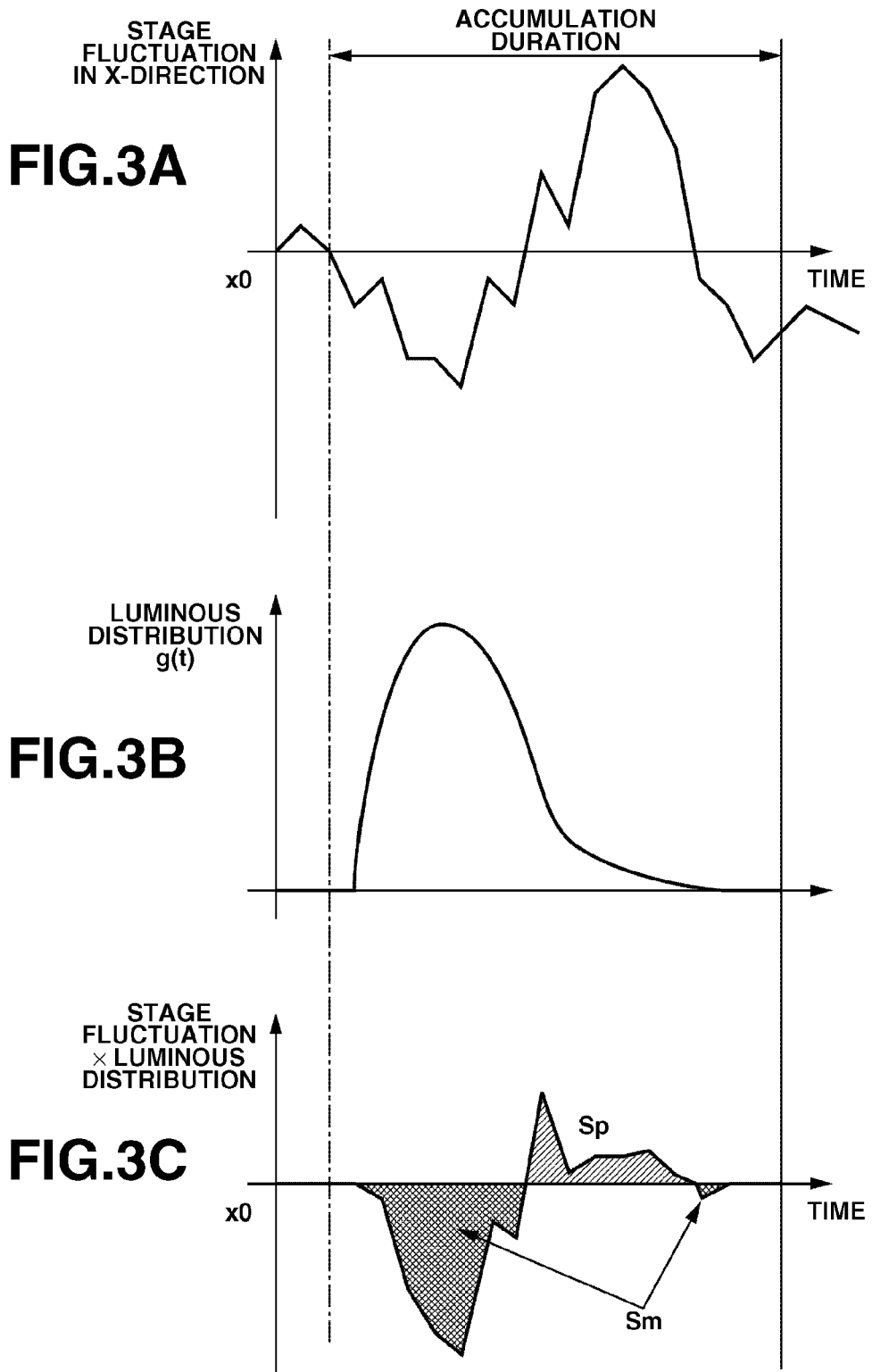

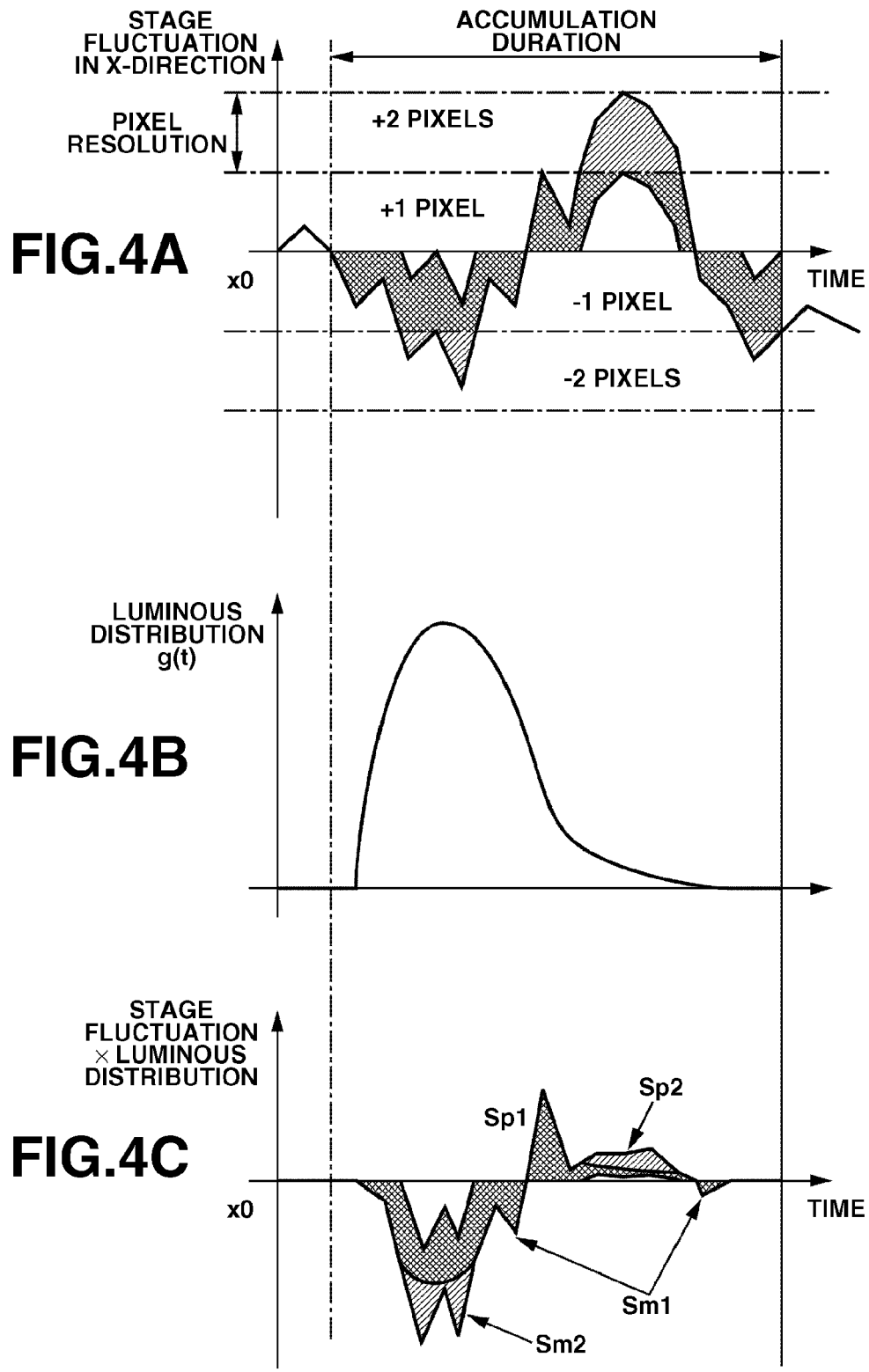

POSITION MEASUREMENT APPARATUS, IMAGING APPARATUS, EXPOSURE APPARATUS, AND DEVICE MANUFACTURING METHOD

BACKGROUND OF THE INVENTION

1. Field of the Invention

The present invention relates to a position measurement apparatus, an imaging apparatus, and an exposure apparatus, which can manufacture a device having a micro pattern, such as an a semiconductor chip (e.g., an integrated circuit (IC) or a large scale integration (LSI)), a liquid crystal panel, a charge coupled device (CCD), a thin-film magnetic head, and a micro machine.

2. Description of the Related Art

A conventional reduced projection exposure apparatus (stepper), capable of manufacturing semiconductor devices, requires a high-accurate technique for capturing an image of a mark formed on a wafer or a reticle and detecting a position of the mark based on a signal waveform obtained from the captured image.

A conventional method for capturing a mark image is described below. FIG. 8 illustrates a conventional exposure apparatus usable in the manufacturing of semiconductor devices. In FIG. 8, "R" represents a reticle (i.e., an original plate for exposure use), "W" represents a wafer (i.e., a substrate to be exposed), and "WM" represents a wafer mark (i.e., a mark to be observed). A projection optical system 1 has an optical axis parallel to a z-axis of the xyz-coordinate system. A mark imaging optical system S includes an alignment illumination unit 2, a beam splitter 3, two imaging optical systems 4 and 5, and an imaging unit 6. Furthermore, the conventional exposure apparatus includes an analog/digital (A/D) conversion circuit 7, an integrating circuit 8, an image processing circuit 9, a stage driving unit 10, a movable stage 11 causing a three-dimensional motion, and a stage position measurement unit 12 (e.g., an interferometer).

The conventional exposure apparatus captures an image of the wafer mark WM in the image area WP according to the following procedure. First, the stage driving unit 10 moves the stage 11 to a position where the stage position measurement unit 12 can observe the mark WM on the stage 11. Next, the alignment illumination unit 2 emits exposure light (luminous flux) that reaches the wafer mark WM via the beam splitter 3, the reticle R, and the projection optical system 1. FIG. 2A illustrates an exemplary wafer mark WM which includes a plurality of same lattice patterns. The luminous flux reflects on the wafer mark WM and returns to the beam splitter 3 via the projection optical system 1 and the reticle R. Furthermore, the luminous flux reflects on the beam splitter 3 and, via the imaging optical system 5, forms an image of the wafer mark WM on an imaging plane of the imaging unit 6.

The imaging unit 6 applies photoelectric conversion to the image of the wafer mark WM. The A/D conversion circuit 7 converts the image signal into a two-dimensional digital signal sequence. The integrating circuit 8 receives the two-dimensional digital signal sequence from the A/D conversion circuit 7 and integrates the received digital signal sequence in the Y-direction of FIG. 2A. In other words, the integrating circuit 8 converts the two-dimensional digital signal into a one-dimensional digital signal sequence $S0(x)$ as illustrated in FIG. 2B. The image processing unit 9 measures a central position of the wafer mark WM based on the converted digital signal sequence, or measures a contrast value as an index for searching a focal position of the optical system.

The above-described mark imaging method is effective when an apparatus requires an accurate waveform of a mark signal. However, as illustrated in FIG. 3A, an x-axis, y-axis or z-axis position of the stage 11 fluctuates during a mark image capturing operation. The position may vibrate or move away from the initially set position (x-axis position x0, y-axis position y0, or z-axis position z0).

Accordingly, the integrating circuit 8 cannot generate an ideal digital signal sequence $S0(x)$ illustrated in FIG. 2B, and generates a deformed signal sequence $S1(x)$ due to fluctuation of the stage 11 as illustrated FIG. 2C. The deformed signal sequence $S1(x)$ may induce measurement errors in image processing, such as a contrast measurement or a pattern matching.

To solve the above-described problem, as discussed in Japanese Patent Application Laid-Open No. 6-36990 or in Japanese Patent Application Laid-Open No. 2003-203839, there is a conventional method for correcting an alignment measurement value or a deformation value of the digital signal sequence based on a continuously monitored stage position during an image accumulation operation.

However, as illustrated in FIG. 3B, the luminous intensity of the alignment illumination unit 2 may fluctuate during an image accumulation operation. In this case, the above-described conventional method cannot accurately correct an alignment measurement value or a deformation value of the digital signal sequence. When the luminous intensity of the alignment illumination unit 2 has a peak value in a temporal distribution, or when the illumination unit 2 emits pulsed light, similar problems may arise.

SUMMARY OF THE INVENTION

Exemplary embodiments of the present invention are directed to an apparatus and technique capable of improving accuracy in a mark position measurement.

According to an aspect of the present invention, an exposure apparatus performs a relative alignment between a reticle and a substrate and exposes the substrate to light via a pattern formed on the reticle. The exposure apparatus includes a movable stage that carries one of the reticle and the substrate, and a position measurement apparatus that measures a position of at least one of the reticle and the substrate. The position measurement apparatus includes an illumination unit configured to emit light toward a mark that indicates the position of the reticle or the substrate, a light intensity measurement unit configured to measure an intensity of the light, an imaging unit configured to capture an image of the mark, a stage position measurement unit configured to measure a position of the stage, and a signal waveform correction unit configured to correct a signal waveform output from the imaging unit based on a change in stage position and a change in illumination light intensity during a period of time the imaging unit captures the image of the mark.

According to another aspect of the present invention, an exposure apparatus performs a relative alignment between a reticle and a substrate and exposes the substrate to light via a pattern formed on the reticle. The exposure apparatus includes a movable stage that carries one of the reticle and the substrate, and a position measurement apparatus that measures a position of at least one of the reticle and the substrate. The position measurement apparatus includes an illumination unit configured to emit light toward a mark that indicates the position of the reticle or the substrate, a light intensity measurement unit configured to measure an intensity of the light, an imaging unit configured to capture an image of the mark, a stage position measurement unit configured to measure a position of the stage, and a mark position correction unit configured to determine an average stage position representing an average position of the stage during an image capturing operation based on a change in stage position and a change in illumination light intensity during a period of time the imaging unit captures the image of the mark, and correct a mark position obtained based on a signal waveform output from the imaging unit with reference to the average stage position.

According to yet another aspect of the present invention, an exposure apparatus performs a relative alignment between a reticle and a substrate and exposes the substrate to light via a pattern formed on the reticle. The exposure apparatus includes a movable stage that carries one of the reticle and the substrate, and a position measurement apparatus that measures a position of at least one of the reticle and the substrate. The position measurement apparatus includes an illumination unit configured to emit light toward a mark that indicates the position of the reticle or the substrate, a light intensity measurement unit configured to measure an intensity of the light, an imaging unit configured to capture an image of the mark, a stage position measurement unit configured to measure a position of the stage, and an imaging control unit configured to cause the imaging unit to initiate the processing for capturing an image of the mark after a position change of the stage and an intensity change of illumination light fall within allowable ranges.

According to yet another aspect of the present invention, an exposure apparatus performs a relative alignment between a reticle and a substrate and exposes the substrate to light via a pattern formed on the reticle. The exposure apparatus includes a movable stage that carries one of the reticle and the substrate, and a position measurement apparatus that measures a position of at least one of the reticle and the substrate. The position measurement apparatus includes an illumination unit configured to emit light toward a mark that indicates the position of the reticle or the substrate, a light intensity measurement unit configured to measure an intensity of the light, an imaging unit configured to capture an image of the mark, a stage position measurement unit configured to measure a position of the stage, and an imaging control unit configured to cause the imaging unit to repeat the processing for capturing an image of the mark when a position change of the stage and an intensity change of illumination light are outside allowable ranges.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments and features of the invention and, together with the description, serve to explain at least some of the principles of the invention.

FIGS. 3A to 3C illustrate an exemplary method for calculating a weighting function based on a change in illumination light intensity and a stage position change in a direction perpendicular to an optical axis of the exposure apparatus illustrated in FIG. 1.

FIGS. 4A to 4C illustrate an exemplary method for calculating a weighting function in a case where the exposure apparatus illustrated in FIG. 1 causes a large change in stage position which exceeds a pixel resolution.

DETAILED DESCRIPTION OF THE EMBODIMENTS

Figure 1:
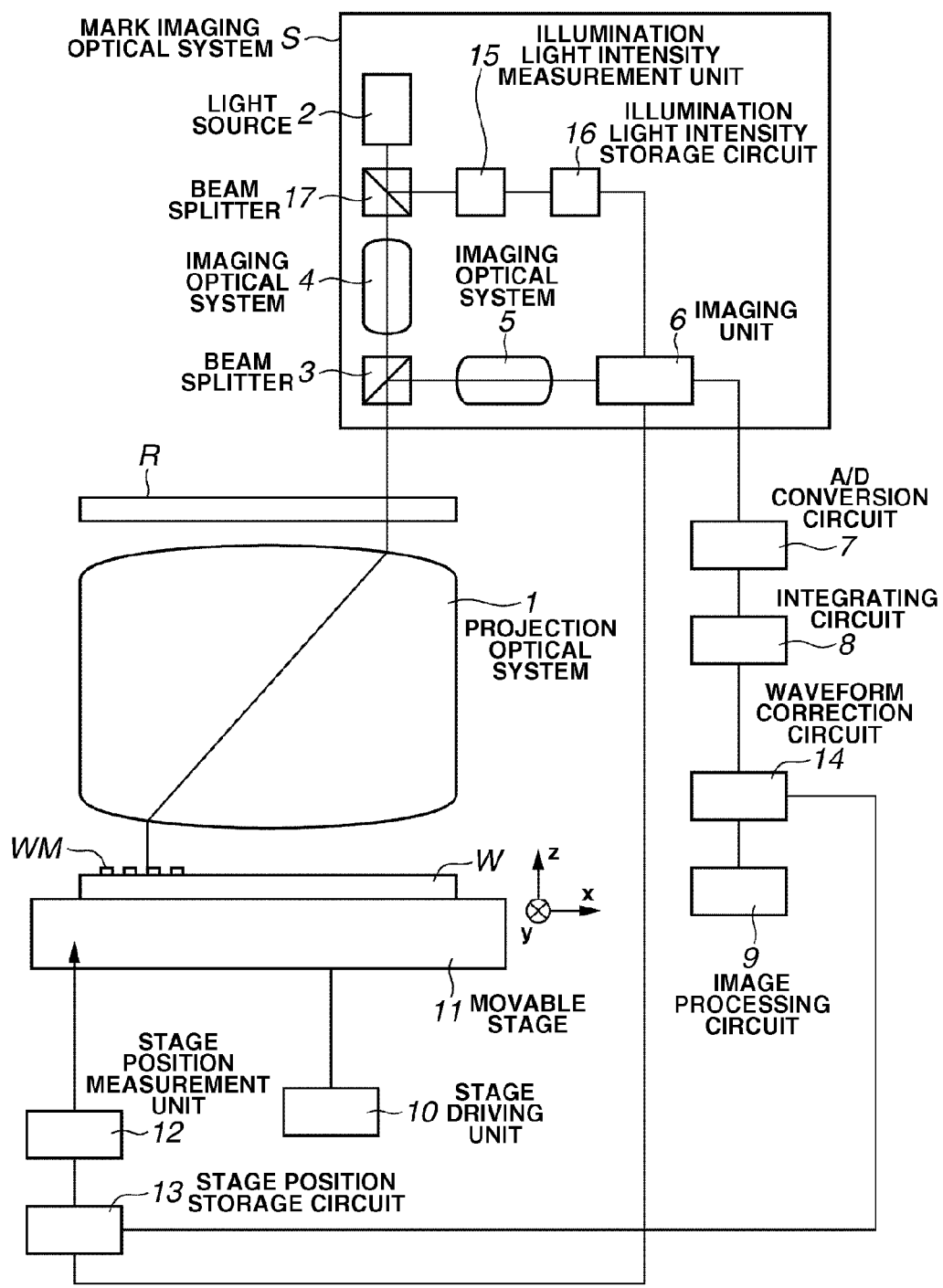
FIG. 1 illustrates an exposure apparatus capable of manufacturing semiconductor devices according to a first exemplary embodiment of the present invention.

The following description of exemplary embodiments is illustrative in nature and is in no way intended to limit the invention, its application, or uses. It is noted that throughout the specification, similar reference numerals and letters refer to similar items in the following figures, and thus once an item is described in one figure, it may not be discussed for following figures. Exemplary embodiments will be described in detail below with reference to the drawings.

An exposure apparatus according to an exemplary embodiment of the present invention is configured to continuously measure a momentary position of a stage and the intensity of illumination light while an imaging system captures an image (i.e., stores electric charge of an image signal) of a mark on the stage. Then, the exposure apparatus corrects the signal sequence $S1(x)$ illustrated in FIG. 2C referring to a stage position distribution and a luminous intensity distribution during an image accumulation operation. Thus, the exposure apparatus can obtain an ideal digital signal sequence $S0(x)$ illustrated in FIG. 2B. The mark used in an exemplary embodiment is, for example, a mark formed on a wafer (e.g., a silicon or glass plane) placed on a stage or formed on a fixed plane of the stage.

First Exemplary Embodiment

FIG. 1 illustrates an exposure apparatus capable of manufacturing semiconductor devices according to a first exemplary embodiment of the present invention. In FIG. 1, "R" represents a reticle, "W" represents a wafer (i.e., a substrate to be exposed), and "WM" represents a wafer mark. A projection optical system 1 has an optical axis parallel to a z-axis of the xyz-coordinate system. A mark imaging optical system S includes a light source 2, two beam splitters 3 and 17, two imaging optical systems 4 and 5, an imaging unit 6 (e.g., CCD), an illumination light intensity measurement unit 15 measuring an intensity of light emitted toward the wafer mark WM, and an illumination light intensity storage circuit 16.

An analog/digital (A/D) conversion circuit 7 receives an analog image signal from the mark imaging optical system S and converts the input analog signal into a digital signal. An integrating circuit 8 generates a one-dimensional digital signal sequence. An image processing circuit 9 performs predetermined processing on an input image signal. A movable stage 11 can cause a three-dimensional movement in the xyz-coordinate system. Namely, the stage 11 moves in x-, y-, and z-axis directions. A stage driving unit 10 drives the movable stage 11. A stage position measurement unit 12, such as a laser interferometer, measures a momentary position of the stage 11 on a plane normal to the optical axis extending in the x- and y-axis directions. A stage position storage circuit 13 stores a measurement result (position data) obtained by the stage position measurement unit 12. A waveform correction circuit 14 corrects the digital signal sequence produced from the integrating circuit 8.

Next, exemplary mark imaging processing and signal waveform correction processing performed by the exposure apparatus illustrated in FIG. 1 is described below. First, the stage driving unit 10 moves the stage 11 to a position where the position measurement unit 12 can observe the wafer mark WM on the stage 11. Next, the light source 2 emits a luminous flux (i.e., light having a wavelength similar to the exposure light to be used for exposing the wafer W) which reaches the wafer mark WM via the beam splitters 17 and 3, the imaging optical system 4, the reticle R, and the projection optical system 1.

Figure 2A:
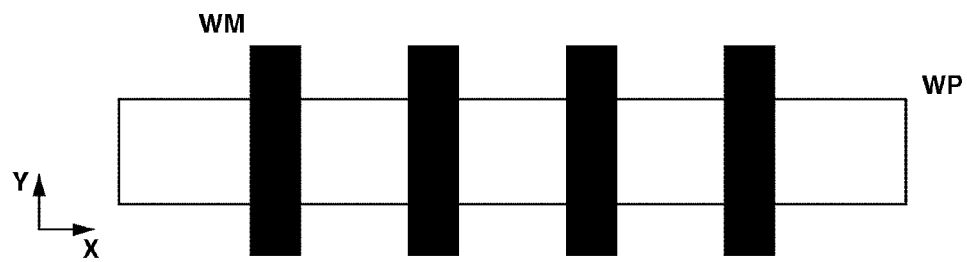
FIGS. 2A to 2C illustrate an exemplary mark used in the exposure apparatus illustrated in FIG. 1 and mark imaging signals.
Figure 2B:
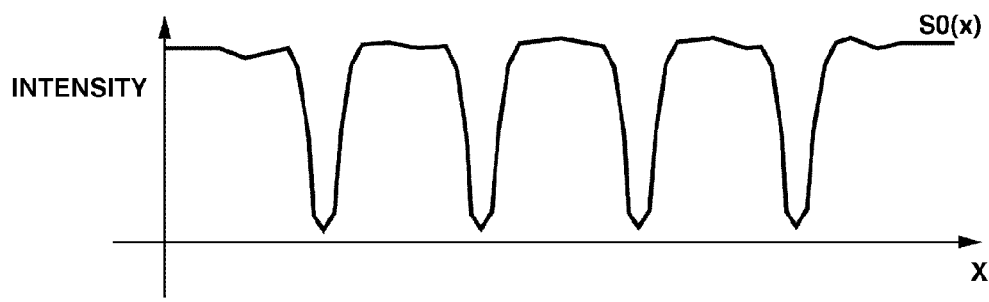

FIG. 2A illustrates an exemplary wafer mark WM which includes a plurality of same lattice patterns. The luminous flux reflects on a surficial region including the wafer mark WM (i.e., an observed plane) and returns to the beam splitter 3 via the projection optical system 1 and the reticle R. Furthermore, the luminous flux reflects on the beam splitter 3 and, via the imaging optical system 5, forms an image of the wafer mark WM on an imaging plane of the imaging unit 6.

The imaging unit 6 applies photoelectric conversion to the image of the wafer mark WM. The imaging unit 6 outputs an imaging signal (i.e., a signal indicating accumulation of electric charge) to the stage position storage circuit 13 and the illumination light intensity storage circuit 16. When the imaging signal is in an ON state, the position measurement unit 12 continuously measures the position of the stage 11. Similarly, the illumination light intensity measurement unit 15 continuously measures the intensity of illumination light. The stage position storage circuit 13 stores the measured stage position, and the illumination light intensity storage circuit 16 stores the measured illumination light intensity.

The A/D conversion circuit 7 receives the mark image signal having been subjected to the photoelectric conversion (charge accumulation) processing from the imaging unit 6 and converts the received image signal into a two-dimensional digital signal sequence S(x,y).

Figure 2C:
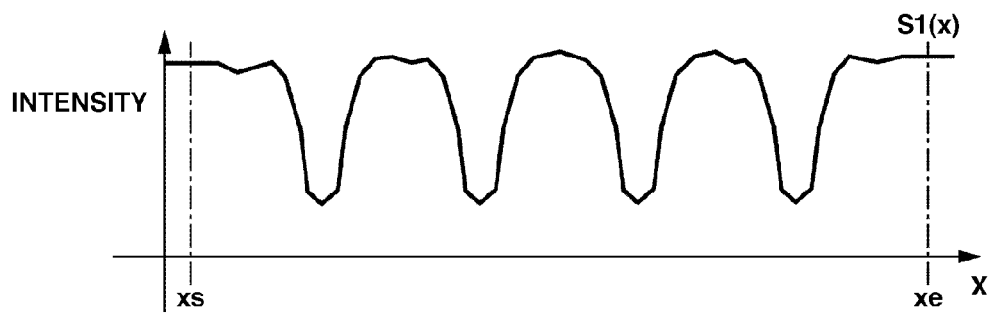

The integrating circuit 8 receives the digital signal sequence S(x,y) from the A/D conversion circuit 7 and integrates the digital signal sequence S(x,y) in the Y-direction of FIG. 2A as illustrated in FIG. 2C. Namely, the integrating circuit 8 converts the two-dimensional digital signal sequence into a one-dimensional digital signal sequence $S1(x)$.

FIG. 3A illustrates a temporal change of the stage position stored in the stage position storage circuit 13 during an imaging operation (charge accumulation operation). FIG. 3B illustrates a temporal change of the illumination light intensity stored in the illumination light intensity storage circuit 16.

The waveform correction circuit 14 serving as a mark position correction unit multiplies the stage position change (data) illustrated in FIG. 3A and the illumination light intensity change (data) illustrated in FIG. 3B. The waveform correction circuit 14 separately integrates vibration components in the +x direction and vibration components in the -x direction as illustrated in FIG. 3C.

The waveform correction circuit 14 obtains a vibration component weighting factor Sp in the +x direction and a vibration component weighting factor Sm in the -x direction based on the integrated data.

As illustrated in TABLE 1, the waveform correction circuit 14 calculates the following 1st-order simultaneous equations with respect to (xe−xs+1) variables based on the digital signal sequence $S1(x)$ and the obtained weighting factors Sp and Sm in the range of x (xs<x<xe).

TABLE 1

$$\begin{pmatrix} S1(xs) \\ S1(xs+1) \\ S1(xs+2) \\ \vdots \\ S1(xn-1) \\ S1(xn) \\ S1(xn+1) \\ \vdots \\ S1(xe-2) \\ S1(xe-1) \\ S1(xe) \end{pmatrix} = \begin{pmatrix} 1-Sp & Sp & & & & & & & \\ Sm & Ss & Sp & & & & & & \\ & Sm & Ss & Sp & & 0 & & & \\ & & & \vdots & & & & & \\ & & & Sm & Ss & Sp & & & \\ & & & & Sm & Ss & Sp & & \\ & & & & & Sm & Ss & Sp & \\ & & & & & & \vdots & & \\ & 0 & & & & & Sm & Ss & Sp \\ & & & & & & & Sm & Ss & Sp \\ & & & & & & & & Sm & 1-Sm \end{pmatrix} \cdot \begin{pmatrix} S0(xs) \\ S0(xs+1) \\ S0(xs+2) \\ \vdots \\ S0(xn-1) \\ S0(xn) \\ S0(xn+1) \\ \vdots \\ S0(xe-2) \\ S0(xe-1) \\ S0(xe) \end{pmatrix}$$

※ Ss = 1 − Sm − Sp

In this case, as illustrated in FIG. 2C, the setting position of xs and xe is outside a region of the wafer mark WM, where the signal sequence $S1(x)$ has a constant value and does not receive any effect from fluctuation in the stage position.

The waveform correction circuit 14 serving as the mark position correction unit solves the above-described 1st-order simultaneous equations with respect to the (xe−xs+1) variables according to the Gaussian elimination widely used for numerical calculations. Then, the waveform correction circuit 14 can obtain the signal sequence $S0(x)$ in the range of xs<x<xe illustrated in FIG. 2B, as a result of correction applied to the stage vibration component considering the illumination light intensity change.

The image processing circuit 9 measures a central position of the wafer mark WM using the corrected digital signal sequence S0(x), or measures a contrast value of the digital signal sequence S0(x) (i.e., a contrast value of the mark image) to detect a focal position (best-focused position) of the projection optical system 1.

An exemplary embodiment obtains the weighting components Sm and Sp of neighboring pixels for the above-described correction, based on an assumption that a position change of the stage 11 is generally smaller than a pixel resolution of the imaging unit 6 and S1(xn) can be determined based on three data of S0(xn−1), S0(xn), and S0(xn+1).

If the position change of the stage 11 is dependent on two preceding pixels and two succeeding pixels, the waveform correction circuit 14 can dissect the vibration component into plural regions according to the pixel resolution as illustrated in FIG. 4A. Then, as illustrated in FIG. 4C, the waveform correction circuit 14 can obtain weighting factors Sm2, Sm1, Ss, Sp1, and Sp2 corresponding to S0(xn−2), S0(xn−1), S0(xn), S0(xn+1), and S0(xn+2), and perform the waveform correction using the obtained weighting factors. If the position change of the stage 11 is dependent on three or more preceding and succeeding pixels, the waveform correction circuit 14 can perform the waveform correction according to a similar procedure.

Furthermore, if a longer processing time is unacceptable, the waveform correction circuit 14 can skip the waveform correction to reduce the processing time. In this case, the waveform correction circuit 14 can use a correction value (mark position) representing an average stage position obtainable according to the weighting function that multiplies the stage position fluctuation with the illumination light intensity change.

If the weighting factors Sm and Sp exceed predetermined setting ranges (allowable ranges) due to large variations in the stage position change and the illumination light intensity change, the waveform correction circuit 14 functioning as an imaging controller can cause an imaging unit 6 to re-execute the processing for capturing an image of the mark MW.

Furthermore, if continuous monitoring of the stage position or the illumination light intensity is feasible before starting an imaging operation (or during a preparation for the imaging operation), the waveform correction circuit 14 functioning as the imaging controller can cause an imaging unit 6 to postpone the processing for capturing an imaging of the mark MW until a deviation or dispersion falls within a predetermined range.

The above-described exemplary embodiment uses a mark capable of measuring the position in the x-axis direction and performs the position measurement in the x-axis direction. However, if rotated by 90 degrees, the above-described mark can be used for position measurement in the y-axis direction. The waveform correction circuit 14 can perform the waveform correction for the position measurement in the y-axis direction according to a procedure similar to the above-described procedure in the x-axis direction.

Second Exemplary Embodiment

According to the first exemplary embodiment, the stage driving unit 10 moves the stage 11 to a position where the position measurement unit 12 can observe the wafer mark WM on the stage 11 and stops the stage 11 to execute a mark position measurement. A second exemplary embodiment is different from the first exemplary embodiment in performing the mark position measurement when the stage 11 is moving.

The exposure apparatus according to the second exemplary embodiment has a hardware arrangement similar to that of the first exemplary embodiment and is not described below. First, the stage driving unit 10 moves the stage 11. The position measurement unit 12 starts the mark position measurement after the wafer mark WM on the stage 11 enters an observation range of the imaging unit 6. The mark position measurement includes emitting a luminous flux from the light source 2 and illuminating the wafer mark WM via the beam splitters 17 and 3, the imaging optical system 4, the reticle R, and the projection optical system 1. FIG. 2A illustrates an exemplary wafer mark WM which includes a plurality of same lattice patterns.

The luminous flux reflects on a surficial region including the wafer mark WM and returns to the beam splitter 3 via the projection optical system 1 and the reticle R. Furthermore, the luminous flux reflects on the beam splitter 3 and, via the imaging optical system 5, forms an image of the wafer mark WM on an imaging plane of the imaging unit 6. The imaging unit 6 applies photoelectric conversion to the image of the wafer mark WM. The imaging unit 6 outputs an imaging signal (i.e., a signal indicating accumulation of electric charge) to the stage position storage circuit 13 and the illumination light intensity storage circuit 16.

When the imaging signal is in an ON state, the position measurement unit 12 continuously measures the position of the stage 11 while the illumination light intensity measurement unit 15 continuously measures the intensity of illumination light. The stage position storage circuit 13 stores the measured stage position, and the illumination light intensity storage circuit 16 stores the measured illumination light intensity. The A/D conversion circuit 7 receives the mark image signal having been subjected to the photoelectric conversion (charge accumulation) processing from the imaging unit 6 and converts the received signal into a two-dimensional digital signal sequence S(x,y). The integrating circuit 8 receives the digital signal sequence S(x,y) from the A/D conversion circuit 7 and integrates the received digital signal sequence S(x,y) in the Y-direction of FIG. 2A. In other words, the integrating circuit 8 converts the two-dimensional digital signal sequence S(x,y) into a one-dimensional digital signal sequence S1(x) as illustrated in FIG. 2C.

Figures 5A, 5B:
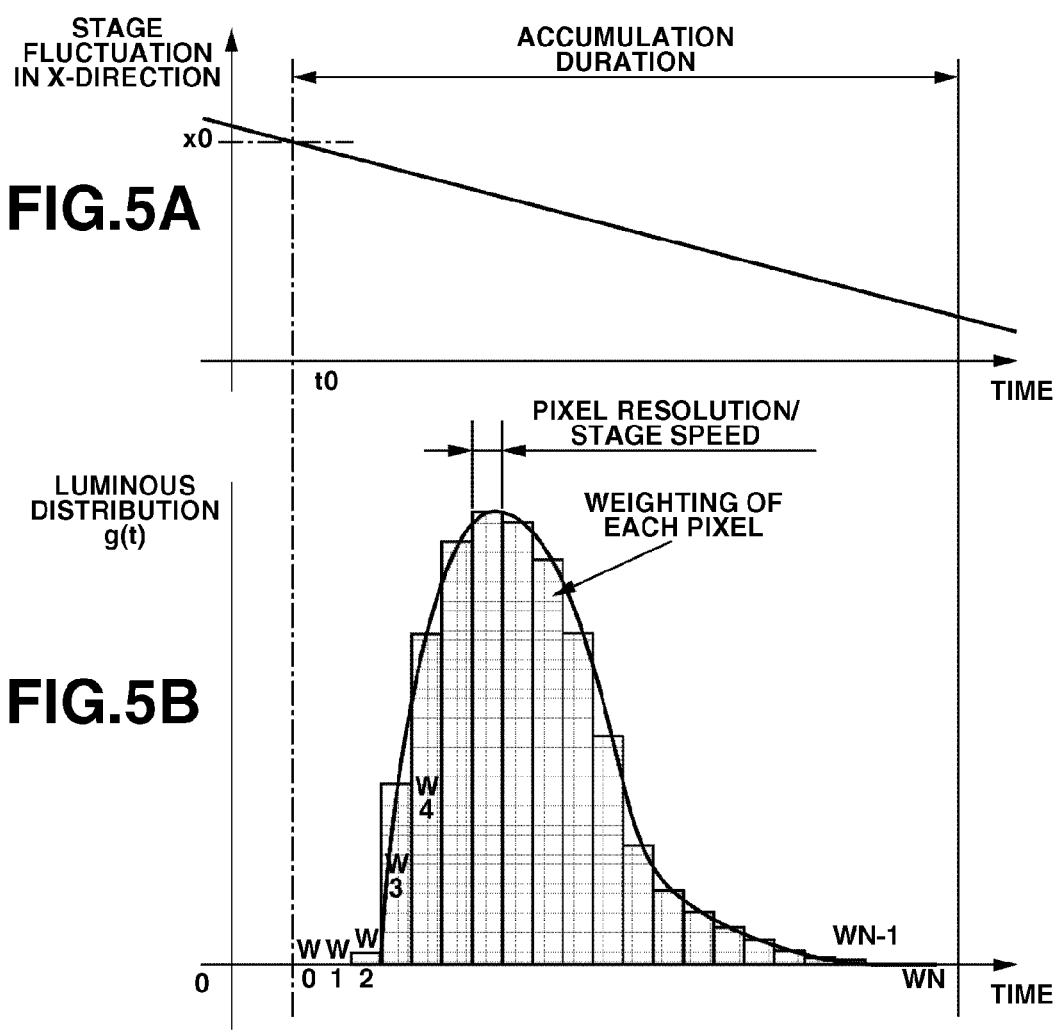
FIGS. 5A and 5B illustrate an illumination light intensity and a weighting function in relation to a stage position of the exposure apparatus illustrated in FIG. 1.

FIG. 5A illustrates a temporal position change of the stage 11 stored in the stage position storage circuit 13 during an imaging operation (image accumulation operation of the imaging unit 6). In this case, the stage 11 is moving in the −x direction. FIG. 5B illustrates a temporal change of the illumination light intensity stored in the illumination light intensity storage circuit 16 during the imaging operation.

The waveform correction circuit 14 calculates weighting factors (W0, W1, W2, - - - , WN) of respective pixels based on the graph of FIG. 5B that illustrates the illumination light intensity change. Each pixel has a time width equivalent to a ratio of the pixel resolution of the imaging unit 6 to the moving speed of the stage 11.

The waveform correction circuit 14 calculates the following 1st-order simultaneous equations with respect to (xe−xs+1) variables based on the digital signal sequence S1(x) in the range of x (xs<x<xe).

$$\begin{bmatrix} S1(xs) \\ S1(xs+1) \\ S1(xs+2) \\ \vdots \\ S1(xn-1) \\ S1(xn) \\ S1(xn+1) \\ \vdots \\ S1(xe-2) \\ S1(xe-1) \\ S1(xe) \end{bmatrix} = \begin{bmatrix} W0 & W1 & W2 & \ldots & WN & & & & & \\ & W0 & W1 & W2 & \ldots & WN & & & 0 & \\ & & W0 & W1 & W2 & \ldots & WN & & & \\ & & & & \vdots & & & & & \\ & & & W0 & W1 & W2 & \ldots & WN & & \\ & & & & \vdots & & & & & \\ & & 0 & & W0 & W1 & \Sigma Wi(i>1) & & & \\ & & & & & W0 & \Sigma Wi(i>0) & & & \\ & & & & & & \Sigma Wi & & & \end{bmatrix} \cdot \begin{bmatrix} S0(xs) \\ S0(xs+1) \\ S0(xs+2) \\ \vdots \\ S0(xn-1) \\ S0(xn) \\ S0(xn+1) \\ \vdots \\ S0(xe-2) \\ S0(xe-1) \\ S0(xe) \end{bmatrix}$$

In this case, as illustrated in FIG. 2C, the setting position of xs and xe is outside a region of the wafer mark WM, where the signal sequence $S1(x)$ has a constant value and does not receive any effect from fluctuation in the stage position.

The waveform correction circuit 14 solves the above-described 1st-order simultaneous equations with respect to the (xe−xs+1) variables according to the Gaussian elimination widely used for numerical calculations. Then, the waveform correction circuit 14 can obtain the signal sequence $S0(x)$ in the range of xs<x<xe illustrated in FIG. 2B, as a result of correction applied to the stage vibration component considering the illumination light intensity change.

The image processing circuit 9 measures a central position of the wafer mark WM using the corrected digital signal sequence $S0(x)$, or measures a contrast value of the digital signal sequence $S0(x)$ (i.e., a contrast value of the mark image) to detect a focal position (best-focused position) of the projection optical system 1.

Although the above-described exemplary embodiment uses a mark for a position measurement in the x-axis direction, a similar mark can be used for a position measurement in the y-axis direction to perform the waveform correction in the same manner. Furthermore, if a longer processing time is unacceptable, the waveform correction circuit 14 can skip the waveform correction to reduce the processing time. In this case, the waveform correction circuit 14 can use a correction value (mark position) representing an average stage position obtainable according to the weighting function that multiplies the stage position fluctuation with the illumination light intensity.

Third Exemplary Embodiment

Figure 6:
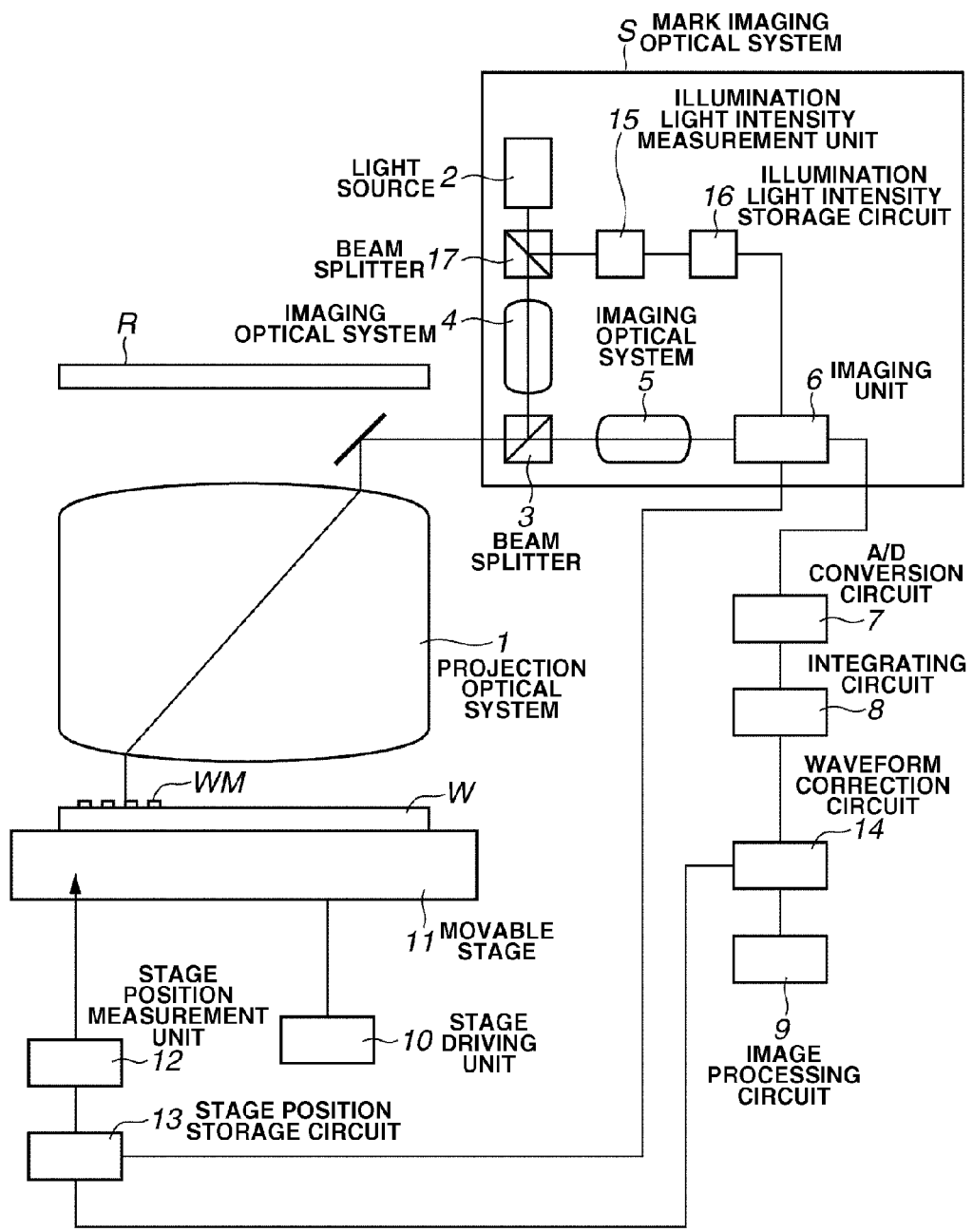
FIG. 6 illustrates an exposure apparatus capable of manufacturing semiconductor devices according to a third exemplary embodiment of the present invention.

FIG. 6 illustrates an exposure apparatus capable of manufacturing semiconductor devices according to a third exemplary embodiment of the present invention. In FIG. 6, "R" represents a reticle, "W" represents a wafer (i.e., a substrate to be exposed), and "WM" represents a wafer mark. A projection optical system 1 has an optical axis parallel to a z-axis of the xyz-coordinate system. A mark imaging optical system S includes a light source 2, two beam splitters 3 and 17, two imaging optical systems 4 and 5, an imaging unit 6 (e.g., CCD), an illumination light intensity measurement unit 15 measuring an intensity of light emitted toward the wafer mark WM, and an illumination light intensity storage circuit (unit) 16.

An analog/digital (A/D) conversion circuit 7 receives an analog image signal from the mark imaging optical system S and converts the input analog signal into a digital signal. An integrating circuit 8 generates a one-dimensional digital signal sequence. An image processing circuit 9 performs predetermined processing on an input image signal. A movable stage 11 can cause a three-dimensional movement in the xyz-coordinate system. Namely, the stage 11 moves in x-, y-, and z-axis directions. A stage driving unit 10 drives the movable stage 11. A stage position measurement unit 12, such as a laser interferometer, measures a momentary position of the stage 11 in the x- and y-axis directions. A stage position storage circuit 13 stores a measurement result (position data) obtained by the stage position measurement unit 12. A waveform correction circuit 14 corrects the digital signal sequence produced from the integrating circuit 8.

The first and second exemplary embodiments are configured to capture an image of the wafer mark WM via the reticle R. However, the third exemplary embodiment can directly capture an image of the wafer mark WM on the stage 11 without using the reticle R. The exposure apparatus according to the third exemplary embodiment performs mark imaging processing and signal waveform correction processing which are similar to those described in the first and second exemplary embodiments.

Fourth Exemplary Embodiment

Figure 7:
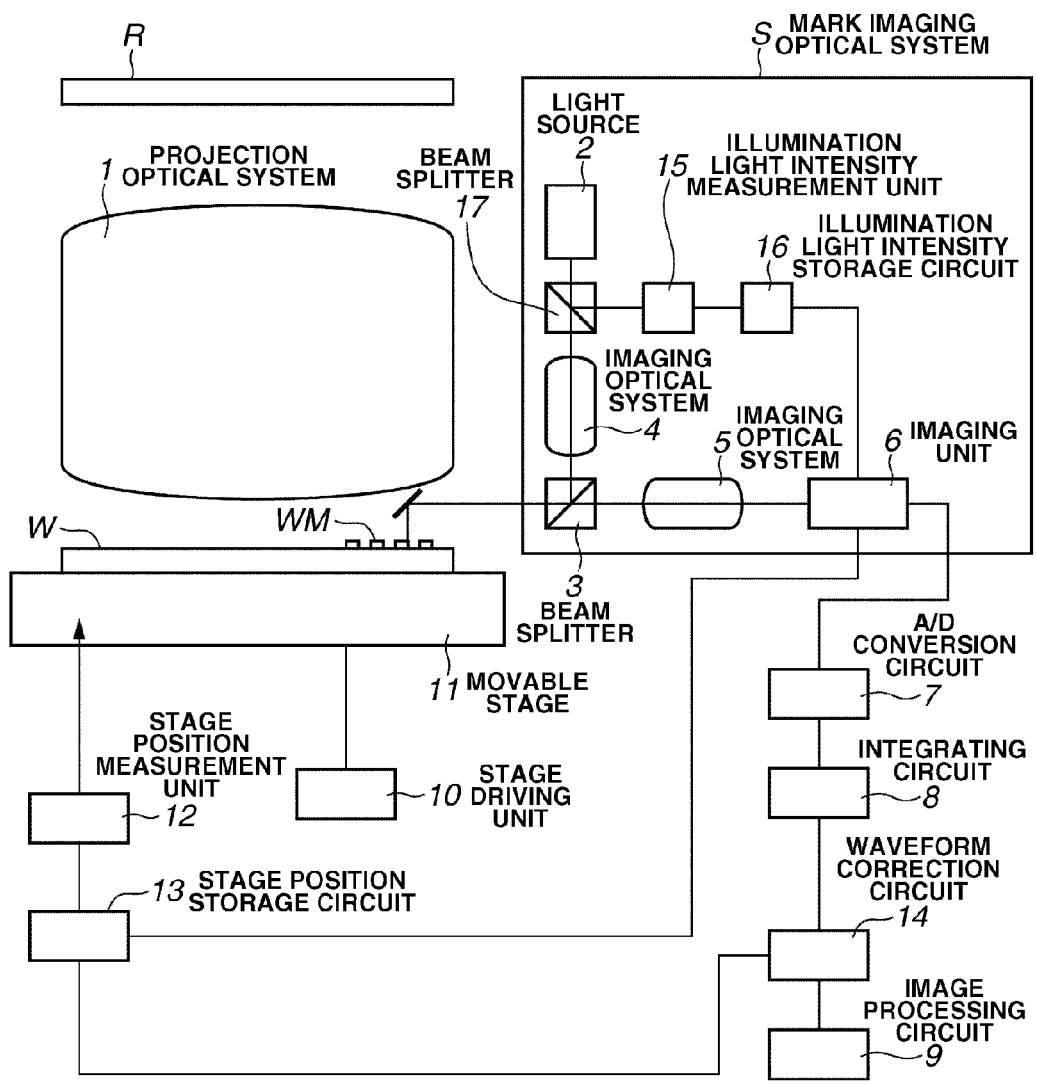
FIG. 7 illustrates an exposure apparatus capable of manufacturing semiconductor devices according to a fourth exemplary embodiment of the present invention.
Figure 8:
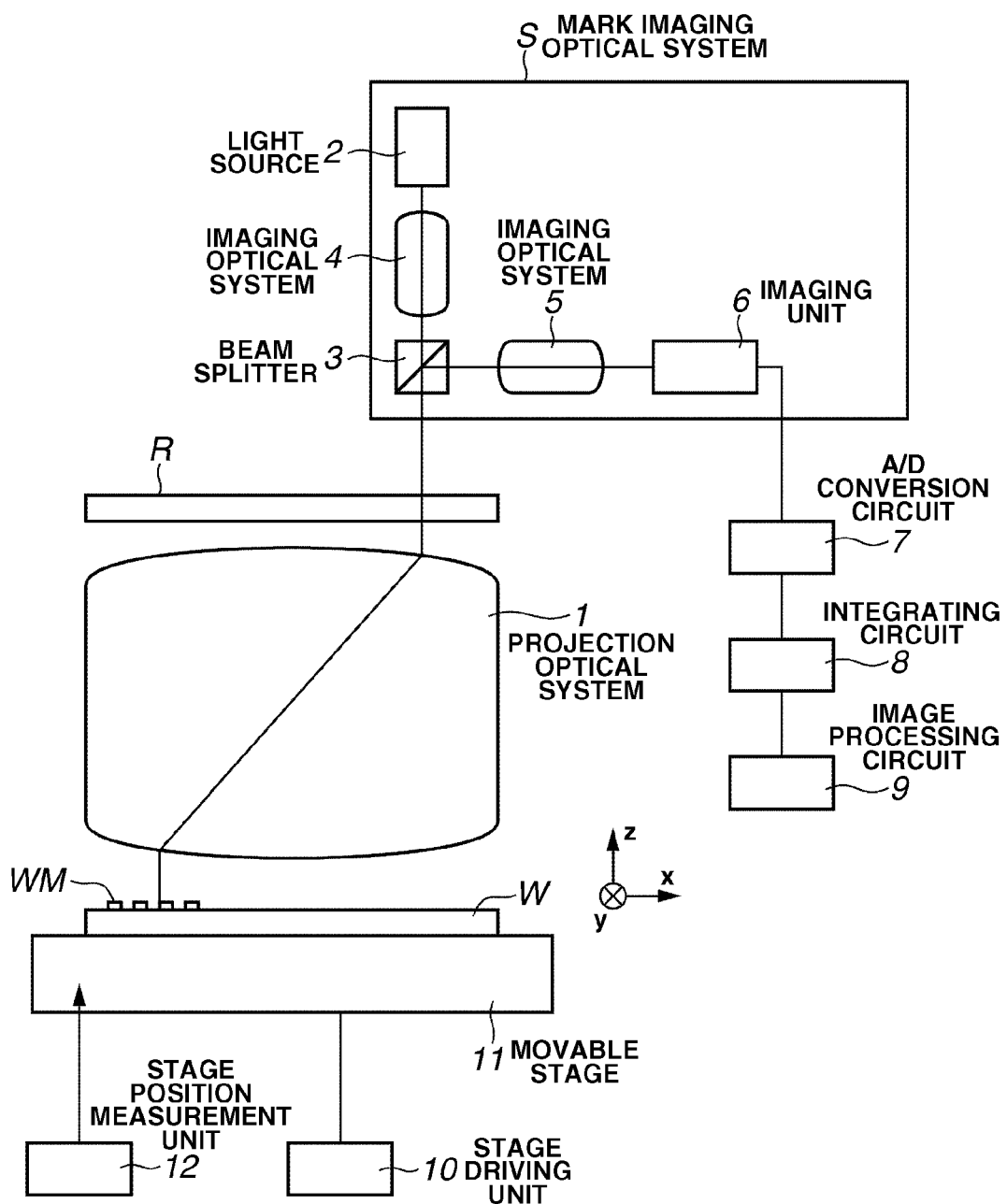
FIG. 8 illustrates a conventional exposure apparatus capable of manufacturing semiconductor devices.

FIG. 7 illustrates an exposure apparatus capable of manufacturing semiconductor devices according to a fourth exemplary embodiment of the present invention. The exposure apparatus according to the fourth exemplary embodiment can directly capture an image of the wafer mark WM on the stage 11 without using the reticle R and the projection optical system 1. The exposure apparatus according to the fourth exemplary embodiment performs mark imaging processing and signal waveform correction processing which are similar to those described in the first and second exemplary embodiments.

As described above, the above-described exemplary embodiments can correct a change in the imaging signal waveform caused by a change in stage position or a change in illumination light intensity during a mark imaging operation, and can perform accurate image processing. Furthermore, an exemplary embodiment can perform a mark position measurement before the stage 11 perfectly stops. An exemplary embodiment can perform a mark position measurement while the stage 11 is not stopped or is continuously moving. Thus, the exemplary embodiments can realize a high-throughput exposure system.

Especially, when the above-described signal waveform correction method is employed, an exposure apparatus can accurately perform contrast measurement processing and pattern matching processing in the manufacturing of a semiconductor device even if the alignment illumination light source is a pulsed light source or a light source causing a large temporal change in the illumination light intensity. Therefore, the above-described exemplary embodiments can bring various effects in the focal position measurement and the mark position measurement.

Fifth Exemplary Embodiment

Exemplary manufacturing processes of a micro device (such as a semiconductor chip (e.g., IC or LSI), a liquid crystal panel, a CCD, a thin-film magnetic head, or a micro machine) using the above-described exposure apparatus is described below.

Figure 9:
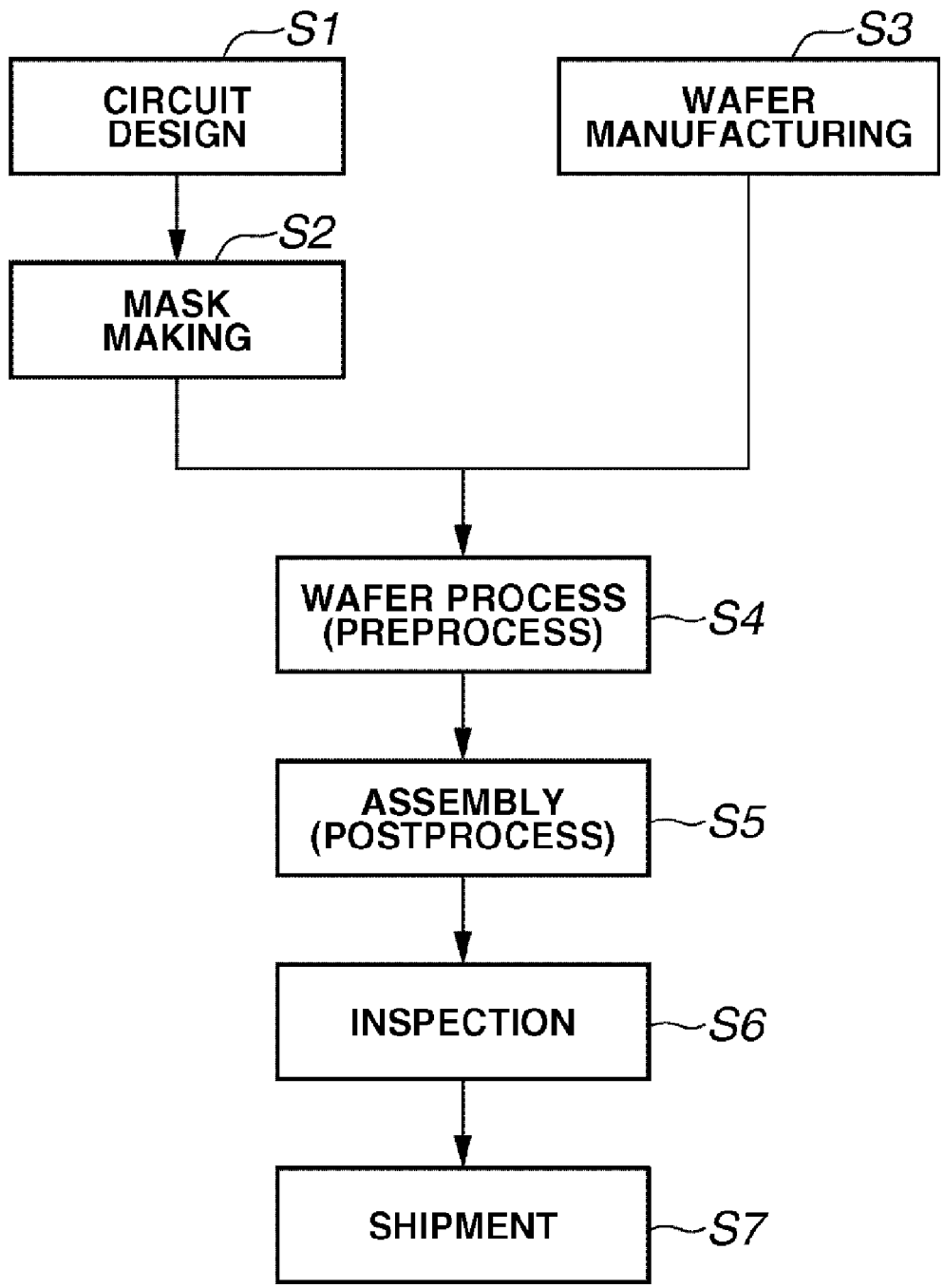
FIG. 9 is a flowchart illustrating exemplary manufacturing processes of a semiconductor device.

FIG. 9 is a flowchart illustrating exemplary manufacturing processes of a semiconductor device. Step S1 (i.e., a circuit design process) is for designing a circuit of a semiconductor device. Step S2 (i.e., a mask making process) is for fabricating a mask that forms a designed pattern. Step S3 (i.e., a wafer manufacturing process) is for manufacturing a wafer from a silicon or comparable material. Step S4 is a wafer process (which is referred to as "preprocess") for forming an actual circuit on a wafer using an exposure apparatus with the above-described prepared mask according to the lithography technique.

Step S5 is an assembling process (which is referred to as "postprocess") for forming a semiconductor chip using the wafer manufactured in step S4. The post process includes an assembly process (e.g., dicing, bonding, etc) and a packaging process (chip sealing). Step S6 (i.e., an inspection process) is for inspecting the semiconductor device manufactured in step S5. The inspection includes an operation confirmation test and an endurance test. Step S7 (i.e., a shipment process) is for shipping the semiconductor device completed through the above-described processes.

The above-described wafer process in step S4 includes an oxidation step of oxidizing a wafer surface, a chemical vapor deposition (CVD) step of forming an insulating film on the wafer surface, and an electrode formation step of forming electrodes on the wafer by vaporization.

Furthermore, the wafer process includes an ion implantation step of implanting ions into the wafer, a resist processing step of coating the wafer with a photosensitive material, and an exposure step of exposing the wafer subjected to the resist processing step to light using the above-described exposure apparatus with a mask having a circuit pattern.

Furthermore, the wafer process in step S4 includes a developing step of developing the wafer exposed in the exposure step, an etching step of cutting a portion other than a resist image developed in the developing step, and a resist separating step of removing unnecessary resist remaining after the etching step is accomplished. The processing repeating the above-described steps can form multiple circuit patterns on a wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2006-341055 filed Dec. 19, 2006, which is hereby incorporated by reference herein in its entirety.

What is claimed is:

1. An exposure apparatus that performs a relative alignment between a reticle and a substrate and exposes a pattern of the reticle onto the substrate, the exposure apparatus comprising:
    a movable stage that carries one of the reticle and the substrate; and
    a position measurement apparatus that measures a position of at least one of the reticle and the substrate, the position measurement apparatus including,
        an illumination unit configured to emit light toward a mark that indicates the position of the reticle or the substrate;
        a light intensity measurement unit configured to measure an intensity of the light;
        an imaging unit configured to capture an image of the mark;
        a stage position measurement unit configured to measure a position of the stage; and
        a signal waveform correction unit configured to correct a signal waveform output from the imaging unit based on a change in stage position and a change in illumination light intensity during a period of time the imaging unit captures the image of the mark.

2. An exposure apparatus that performs a relative alignment between a reticle and a substrate and exposes a pattern of the reticle onto the substrate, the exposure apparatus comprising:
    a movable stage that carries one of the reticle and the substrate; and
    a position measurement apparatus that measures a position of at least one of the reticle and the substrate, wherein the position measurement apparatus includes,
        an illumination unit configured to emit light toward a mark that indicates the position of the reticle or the substrate;
        a light intensity measurement unit configured to measure an intensity of the light;
        an imaging unit configured to capture an image of the mark;
        a stage position measurement unit configured to measure a position of the stage; and
        a mark position correction unit configured to determine an average stage position representing an average position of the stage during an image capturing operation based on a change in stage position and a change in illumination light intensity during a period of time the imaging unit captures the image of the mark, and correct a mark position obtained based on a signal waveform output from the imaging unit with reference to the average stage position.

* * * * *